(12) United States Patent
Hamada et al.

(10) Patent No.: US 7,674,391 B2
(45) Date of Patent: Mar. 9, 2010

(54) MANUFACTURING METHOD OF OPTICAL SEMICONDUCTOR DEVICE

(75) Inventors: Hiroshi Hamada, Komoro (JP); Kazunori Saitoh, Ueda (JP)

(73) Assignee: Opnext Japan, Inc., Kanagawa (JP)

( * ) Notice: Subject to any disclaimer, the term of this patent is extended or adjusted under 35 U.S.C. 154(b) by 402 days.

(21) Appl. No.: 11/700,215

(22) Filed: Jan. 31, 2007

(65) Prior Publication Data

US 2007/0284336 A1   Dec. 13, 2007

(30) Foreign Application Priority Data

Jun. 7, 2006   (JP) .............................. 2006-158294

(51) Int. Cl.
*B29D 11/00* (2006.01)

(52) U.S. Cl. .............................. 216/24; 216/37; 216/67; 438/22; 438/29; 385/5; 385/16; 385/123; 385/131

(58) Field of Classification Search ................... 216/24; 438/22; 385/5
See application file for complete search history.

(56) References Cited

U.S. PATENT DOCUMENTS 5,418,396 A * 5/1995 Mita .......................... 257/461
5,754,714 A * 5/1998 Suzuki et al. .................. 385/5
2006/0094141 A1 * 5/2006 Tsunoda et al. ............... 438/22

FOREIGN PATENT DOCUMENTS

| JP | 11-17269 | 6/1997 |
|---|---|---|
| JP | 2005-5996 | 6/2003 |

* cited by examiner

*Primary Examiner*—Shamim Ahmed
*Assistant Examiner*—Maki Angadi
(74) *Attorney, Agent, or Firm*—Stites & Harbison, PLLC; Juan Carlos A. Marquez, Esq.

(57) ABSTRACT

It is an objective to control the occurrence of the disorder of a far-field pattern and of an optical axial shift. A manufacturing method of a semiconductor laser device has the step for preparing a semiconductor substrate which has growth of a multi-layer including an active layer, the step for forming a mask over the growth of a multi-layer, and a step for forming a stripe-shaped ridge by dry etching and wet etching. A structure stacking a p-type AlGaInP layer, an etch-stop layer, a p-type $Al_{x=0.7}GaInP$ layer, a p-type $Al_{x=0.6}GaInP$ layer, a p-type GaAs layer, in order, over the active layer is taken in order to make the tailing part created in the dry etching process smaller by wet etching. The tailing part is composed of a p-type $Al_{x=0.7}GaInP$ layer including a high mixed crystal ratio of aluminum. Therefore, the p-type $Al_{x=0.7}GaInP$ layer is etched faster than the p-type $Al_{x=0.6}GaInP$ layer during wet etching, so that the tailing part becomes smaller, the far-field pattern of the semiconductor laser device is not disordered, and the optical axis shift does not occur.

12 Claims, 12 Drawing Sheets

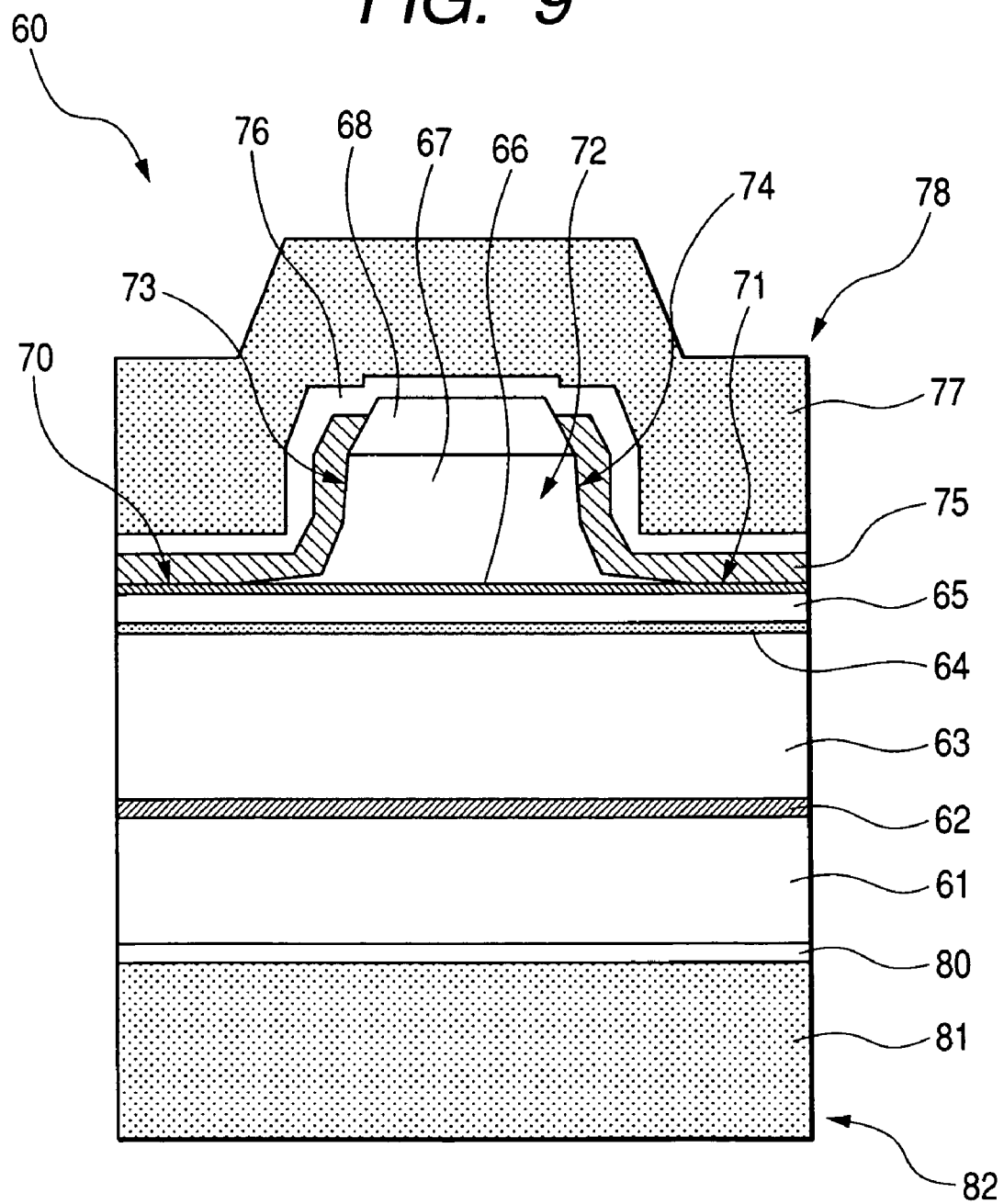

MANUFACTURING METHOD OF OPTICAL SEMICONDUCTOR DEVICE

CLAIM OF PRIORITY

The present application claims priority from Japanese application JP 2006-158294 filed on Jun. 7, 2006, the content of which is hereby incorporated by reference into this application.

FIELD OF THE INVENTION

The present invention relates to a manufacturing method of an optical semiconductor device, for instance, it relates to a technology which is effective in applying a manufacturing technology for a semiconductor laser device having a ridge structure (LD: semiconductor laser device).

BACKGROUND OF THE INVENTION

A semiconductor laser device (LD) as an optical semiconductor device is used a lot as a light source in an optical communication system and a light source in information processing equipment. A visible radiation semiconductor laser is used as a light source in information processing equipment such as a document filing system as well as in CD and DVD equipment, laser printers, POS, and bar-code readers. As a structure of the semiconductor laser device (optical semiconductor device), a so-called ridge structure is well known (for instance, JP-A No. 5696/2005 and JP-A No. 17269/1999).

JP-A No. 5696/2005 describes that the step for forming the ridge stripe structure includes the steps of first etching and second etching. The step for first etching is an etching process where the second conducting type second and third cladding layers are etched by dry etching to leave a prescribed thickness. The step of second etching is an etching process where the second conducting type second cladding layer which is left with a prescribed thickness is etched to the etching stop layer and removed by wet etching. Moreover, the same document describes that a tailing part appears in the etching stop layer even though the ridge stripe structure becomes a vertical mesa structure by dry etching, and with this a problem arises that the luminescence property of the laser device is deteriorated.

SUMMERY OF INVENTION

In the manufacturing process of an optical semiconductor device (semiconductor laser device) for recording a DVD and for high output, the ridge which becomes an optical part is manufactured by dry etching and wet etching.

However, a tailing part is formed in a ridge manufactured by such dry etching and wet etching.

FIGS. 9 to 12 are drawings illustrating an optical semiconductor device (semiconductor laser device) and a manufacturing method thereof which are discussed prior to the present invention. FIG. 9 is a part of a cross-sectional drawing illustrating the outline of a semiconductor laser device. FIGS. 10A to 10E are schematic cross-sectional drawings illustrating a semiconductor substrate in each step from the growth of a multi-layer to ridge formation in a manufacturing method of a semiconductor laser device. FIG. 11 are schematic cross-sectional drawings illustrating a semiconductor substrate in each step from contact hole formation to dicing in a manufacturing method of a semiconductor laser device.

As shown in FIG. 9, an optical semiconductor device (semiconductor laser device) 60 includes the growth of a multi-layer composed of a compound semiconductor over the first surface of a first conducting type semiconductor substrate 61 composed of, for instance, n-type GaAs. This growth of a multi-layer is formed of semiconductor layers which are formed, in order, over the first surface of the semiconductor substrate 61. That is, an n-type buffer layer 62, an n-type first cladding layer 63, an active layer 64, a p-type first cladding layer 65, an etch-stop layer 66, a p-type second cladding layer 67, and a contact later 68 are formed, in order, over the semiconductor substrate 61. The n-type buffer layer 62 is composed of GaAs. The first cladding layer 63 is composed of n-type $Al_{x=0.6}GaIn$. The active layer 64 has a multiple quantum well structure including a barrier layer composed of an AlGaInP layer and a well layer composed of a GaInP layer. The p-type first cladding layer 65 is composed of the second conducting type (p-type) $Al_{x=0.6}GaInP$. The etch-stop layer 66 is composed of a layer including at least one layer or more of a p-type GaInP layer. The p-type second cladding layer 67 is composed of a p-type $Al_{x=0.6}GaInP$. The contact layer 68 is composed of p-type GaAs.

Two separation grooves, 70 and 71, are formed from the upper surface of the contact layer 68 to the lower surface of the second cladding layer 67 on the first surface side of the semiconductor substrate 61. The bottom of the separation grooves, 70 and 71, is formed of an etch-stop layer 66. The part sandwiched by the two separation grooves, 70 and 71, becomes a stripe-shaped ridge (rib) 72. The width of this ridge 72 is about several microns.

At the first surface of the semiconductor substrate 61, are provided insulating films 75 are respectively provided, which cover the part from each side face 73, 74 facing the separation grooves, 70 and 71, of the ridge 72 to the side edge of the semiconductor substrate, which is not shown in the figure, including the separation grooves, 70 and 71 and across the separation grooves, 70 and 71. Moreover, an electrode 76 composed of a metal is formed at the first surface side of the semiconductor substrate 61. This electrode film 76 is provided over the upper surface of the ridge 72 and the insulating film 75. In addition, a Au plating film 77 composed of Au is formed to overlap the electrode film 76, resulting in the first electrode (p electrode) 78 being formed. An electrode film 80 composed of a metal is formed over the second surface which is the opposite face of the first surface of the semiconductor substrate 61. Moreover, a Au plating film 81 composed of Au is formed to overlap the electrode film 80, resulting in the second electrode (n electrode) 82 being formed.

In such a semiconductor laser device 60, a laser beam is emitted from both end faces of the semiconductor laser device 60 orthogonal to the lying direction of the ridge 72 by applying a prescribed voltage between the first electrode (p electrode) 78 and the second electrode (n electrode) 82. The stripe-shaped active layer part corresponding to the ridge 72 becomes an optical guided wave path (resonator) and both ends of this optical guided wave path form the output face from which the laser beam is emitted.

Such a semiconductor laser device 60 is manufactured as shown in FIGS. 10A to 10E and FIGS. 11A to 11D.

First of all, a semiconductor substrate 61 composed of a several hundred micron thick n-type GaAs is prepared.

Next, the growth of a multi-layer is formed over the first surface of the semiconductor substrate 61 by using an MOCVD (organometallic chemical vapor deposition method). As shown in FIG. 10A, the growth of a multi-layer consists of an n-type buffer layer 62, a first cladding layer 63, an active layer 64, a p-type first cladding layer 65, an etch-stop layer 66, a p-type second cladding layer 67, and a contact layer 68 which are deposited, in order, over the semiconductor substrate 61.

Next, an insulating layer (SiO$_2$ film) is formed over the upper surface of the contact layer 68 by using a CVD method. Then, the SiO$_2$ film is patterned by using a conventional photolithographic technique and an etching technique, and, as shown in FIG. 10B, a stripe-shaped (band-shaped) etching mask for ridge formation 85 for making the ridge 72 and etching masks for element fixation 86 are formed, which are placed at positions, respectively, far from a prescribed distance from this etching mask for ridge formation 85.

Next, the contact layer 68 is etched anisotropically by using the etching mask for ridge formation 85 and the etching mask for element fixation 86 as a mask. Thereby, as shown in FIG. 10C, the contact layer 68, that is, the ridge part contact layer and the element fixation part contact layer are formed underneath the etching mask for ridge formation 85 and the etching mask for element fixation 86. Moreover, by anisotropic wet etching, the edges of the ridge part contact layer and the element fixation part contact layer are formed at an incline. Since they are formed at an incline, the step coverage property (step coating property) becomes excellent when the insulating film 75 is formed afterward.

Next, as shown in FIG. 10D, the p-type second cladding layer 67 is etched by using the etching mask for ridge formation 85, the etching mask for element fixation 86, the ridge part contact layer, and the element fixation part contact layer as a mask, resulting in two separation grooves, 70 and 71, being formed. The bottom of the separation grooves, 70 and 71, are formed by the etch-stop layer 66. The part sandwiched by the two separation grooves, 70 and 71, becomes the band-shaped (stripe-shaped) ridge 72. For instance, the width of the ridge 72 is 2 μm.

When it is dry-etched, etching for the bottom corners of the separation grooves, 70 and 71, is insufficient and, as shown in FIG. 10D, a tailing part 90 which has a long tailing part remains at both sides of the groove bottom. Therefore, as shown in FIG. 10E, wet etching is performed. Before wet etching, the etching mask for ridge formation 85 and the etching mask for element fixation 86 are removed.

Next, as shown in FIG. 11A, the insulating film 75 is selectively formed at the side of the first surface of the semiconductor substrate 61. A contact hole 91 is provided in the insulating film 75 over the upper surface of the ridge 72. In the formation of the insulating film 75, the contact hole 91 is formed by etching the insulating film at the upper surface part of the ridge 72 to be a prescribed width along the stripe of the ridge after the insulating film is formed at the whole area of the first surface side of the semiconductor substrate 61. The ridge part contact layer (contact layer 68) is exposed at the bottom of this contact hole 91.

Next, as shown in FIG. 11B, the electrode film 76 is formed to cover the ridge 72 and the separation grooves, 70 and 71, by a deposition technique. Moreover, as shown in FIG. 11C, the first electrode (p electrode) 78 is formed by forming the Au plating film 77 over the electrode film 76.

Next, although it is not shown in the figure, the second surface of the semiconductor substrate 61 is ground to a prescribed thickness and the thickness of the semiconductor substrate 71 is formed to a thickness of about 100 μm.

Next, the electrode film 80 is formed at the second surface of the semiconductor substrate 61 as an underlayer electrode, and the Au plating film 81 is formed to overlap this electrode film 80, resulting in the second electrode (n electrode) 82 being formed.

Next, although it is not shown in the figure, plural semiconductor laser devices 60 as shown in FIG. 9 are manufactured by cutting the semiconductor substrate 61, etc. throughout the length and breadth.

In such a manufacturing method of a semiconductor laser device 60, the ridge 72 is formed by dry etching as shown in FIG. 10D and by wet etching as shown in FIG. 10E. Since etching the bottom corners of the separation grooves 70 and 71 is insufficient when dry etching is applied, tailing parts 90 which have a long tailing length are created at both sides of the groove bottom as shown in FIG. 10D. The length of the tailing becomes, for instance, from 1.0 μm to 1.4 μm. Moreover, it is difficult to make no tailing part even if wet etching is applied, and, for instance, short tailing parts 90a which have the length of about 0.5 to 0.75 μm are formed as shown in FIG. 10E.

FIG. 12 is a schematic drawing selectively illustrating the ridge 72 part of the semiconductor laser device 60. It is desirable that the lower part of the ridge 72 be etched as shown in the alternate long and short dashed line by a wet etching. However, the etching rate of the etchant becomes lower at the corner, so that the short tailing part 90a is formed as shown in FIG. 12. The length "a" of the rib of this short tailing part 90a becomes about 0.5 to 0.75 μm as previously mentioned.

Thus, the shape of the far-field pattern (FFP) of the laser beam is disordered and the optical axis shift is occurred when there is a tailing part of about 0.5 to 0.75 μm. FIG. 13 shows an optical distribution of a far-field pattern of a laser beam. In the case when the tailing part is small, for instance, from 0.0 to 0.5 μm, the shape of the far-field pattern becomes 0th mode, so that the optical distribution is not disordered and it becomes a symmetric single peak distribution. When the tailing part becomes greater than about 0.5 μm, a high order mode such as a 1st mode, etc. appears in the far-field pattern. FIG. 13 shows a 1st mode as a high order mode. When the 1st mode appears, the optical distribution synthesized by this 1st mode and 0th mode is created. The synthesized optical distribution is not only disordering the optical distribution but also shifting the optical axis to the 0th mode.

The disorder of the optical distribution and the shift of the optical axis are undesirable as the source of light such as a DVD where the light is taken by using a lens system.

It is an objective to provide a manufacturing method of an optical semiconductor device where the optical distribution is not disordered and the optical axis shift does not occur.

The aforementioned and other objectives and new features of the present invention will become apparent from the following description and the accompanying drawings of this specification.

The outline of a typical one of the inventions disclosed in the present application will be simply described as follows;

(1) A manufacturing method of an optical semiconductor device includes;

(a) a step for preparing a semiconductor substrate which is a first conducting type having a first surface and a second surface which becomes an opposite surface of the first surface, (b) a step for performing continuous epitaxial growth so as to deposit a first conducting type first cladding layer, an active layer, a second conducting type first cladding layer, a second conducting type etch-stop layer, a second conducting type second cladding layer, a second conducting type third cladding layer, and a second conducting type contact layer, in order, over the first surface of the semiconductor substrate, (c) a step for forming a stripe-shaped etching mask for ridge formation over the contact layer and an etching mask for element fixation which is situated separated by a prescribed distance at both sides of the etching mask for ridge formation, by a coating film formation and selective etching of the coating film, (d) a step for etching the contact layer from the top face to the bottom face using the etching masks as a mask and forming a ridge part contact layer and an element fixation part contact layer below the etching mask for ridge formation and the etching mask for element fixation, (e) a step for forming a separation groove which reaches the etch-stop layer by dry etching the second conducting type second cladding layer and the second conducting type third cladding layer using both etching masks, the ridge part contact layer and the element fixation part contact layer as the mask and forming a ridge sandwiched between two formed separation grooves, (f) a step for making the width of the ridge to a prescribed dimension (from 1 to 2 µm) by performing wet etching (etching using an etchant composed of HF and $H_2O$) after removing both etching masks, (g) a step for forming an insulating film having a contact hole over the upper face of the ridge at the first surface side of the semiconductor substrate, (h) a step for forming a first electrode, which is connected to the ridge part contact layer through the contact hole, over the insulating film, (i) a step for forming a second electrode at the second surface side of the semiconductor substrate, wherein, in the epitaxial growth of the step (b), the second conducting type second cladding layer is composed of a material which has a greater etching rate compared with the etching rate of the second conducting type third cladding layer while wet etching in the step (f).

Moreover, in the epitaxial growth of the step (b), on the first surface of the GaAs substrate the first cladding layer is formed of an AlGaInP layer; the active layer is formed as a multiple quantum well structure consisting of an AlGaInP layer barrier layer and a GaInP layer well layer; the second conducting type first, second, and third cladding layers are each formed of AlGaInP layers, respectively; the etch-stop layer is formed of a GaInP layer or a quantum well structure of AlGaInP and GaInP; and the contact layer is formed of a GaAs layer. The second conducting type first, second, and third cladding layers are each composed of p-conducting type $Al_xGaInP$ and the mixed crystal ratio x of Al in the second conducting type second cladding layer is greater than that in said second conducting type third cladding layer. For instance, the second conducting type third cladding layer is composed of p-conducting type $Al_{x=0.6}GaInP$ and the second conducting type second cladding layer is composed of p-conducting type $Al_{x=0.7}GaInP$. The second conducting type second cladding layer is formed to be from 0.2 to 0.3 µm in thickness and the second conducting type third cladding layer is formed to be from 1.4 to 1.5 µm in thickness in the epitaxial growth of step (b). In the wet etching of step (f), the width of the ridge is formed to be from 1 to 2 µm. In step (d), the edges of the ridge part contact layer and the element fixation part contact layer are formed at an incline by wet etching using an anisotropic etching technique.

(2) In the means described above (1), the second conducting type second cladding layer is etched so as to leave from 0.08 to 0.1 µm in the dry etching of step (e), and, in the wet etching of step (f), the remaining second conducting type second cladding layer is etched.

The effects achieved by utilizing a typical one of the inventions disclosed in the present application will be briefly described as follows;

According to the means described in the aforementioned (1), in the epitaxial growth in the aforementioned step (b), the second conducting type second cladding layer is composed of a material which has a greater etching rate compared with the etching rate of the second conducting type third cladding layer. That is, the second conducting type third cladding layer is composed of p-conducting type $Al_{x=0.6}GaInP$ and the second conducting type second cladding layer is composed of p-conducting type $Al_{x=0.7}GaInP$ with a thickness of 0.2 to 0.3 µm. The ridge is formed by dry etching in the aforementioned step (e). However, the tailing parts which have a long tailing length are created at the base part of the ridge according to the etching performance of the dry etching. Since the second conducting type second cladding layer becomes 0.2 to 0.3 µm, the tailing part is formed of the second conducting type second cladding layer. Therefore, when wet etching is performed to determine the dimension of the ridge width, the tailing part becomes smaller because the tailing part composed of the second conducting type second cladding layer is etched faster than the second conducting type third cladding layer. That is, the tailing length of the tailing part becomes shorter, for instance, from about 0 to 0.5 µm. As a result, a high-order mode such as the 1st mode, etc. does not occur in the far-field pattern (FFP) of the manufactured semiconductor laser device and the far-field pattern becomes 0th mode having a symmetric single peak distribution. A semiconductor laser where the optical distribution of the far-field pattern is not disordered and the optical axis is not shifted is preferable for a light source of a DVD, etc. where light is introduced by using a lens system.

(b) It becomes a semiconductor laser device which has low loss by photoabsorption. In the high output semiconductor laser element for a DVD, the beam aspect is made smaller by narrowing the beam flare angle in the vertical direction and the laser beam is utilized efficiently. In a conventional semiconductor laser device, the beam flare angle in the vertical direction becomes 30 degrees or less and the beam flare angle in the horizontal direction becomes 7 degrees. In a semiconductor laser device of the present invention, the beam flare angle in the vertical direction becomes 17 degrees and the beam flare angle in the horizontal direction becomes 10 degrees. When the beam flare angle in the vertical direction is made smaller like this, the permeation of light into the second conducting type third cladding layer becomes greater and the photoabsorption at the GaAs contact layer increases. In order to control the increase in this photoabsorption, the second conducting type third cladding layer is formed to have a thickness from 1.4 to 1.5 µm.

(d) the aforementioned wet etching is performed by using an anisotropic etching technique in the aforementioned step (d) and the edges of the ridge part contact layer and the element fixation part contact layer are formed at an incline. By forming it at an incline, the step coverage property (step coating property) by the insulating film becomes excellent when the insulating film is formed afterward to cover the surface of the ridge, resulting in the reliability of the semiconductor laser device being improved.

In the aforementioned means (2), the second conducting type second cladding layer is etched to leave a thickness of 0.08 to 0.1 µm in the dry etching of the step (e) of the means (1), and the second conducting type second cladding layer which remains is etched in the wet etching of step (f). Since the second conducting type second cladding layer is formed to be from 0.2 to 0.3 µm in thickness, the tailing part created by dry etching is also formed of the second conducting type second cladding layer. Therefore, since the etching rate of the second conducting type second cladding layer becomes lower than the etching rate of the second conducting type third cladding layer in the following wet etching, the tailing part thereof becomes smaller. That is, the tailing length of the tailing part becomes smaller, for instance, from about 0 to 0.05 μm. As a result, a high-order mode such as the 1st mode, etc. does not occur in the far-field pattern (FFP) of the manufactured semiconductor laser device and the far-field pattern becomes 0th mode having a symmetric single peak distribution.

BRIEF DESCRIPTION OF THE DRAWINGS

FIG. 9 is an enlarged cross-sectional drawing illustrating a part of the semiconductor laser device studied prior to this invention;

DETAILED DESCRIPTION OF THE REFERRED EMBODIMENTS

Figure 1:
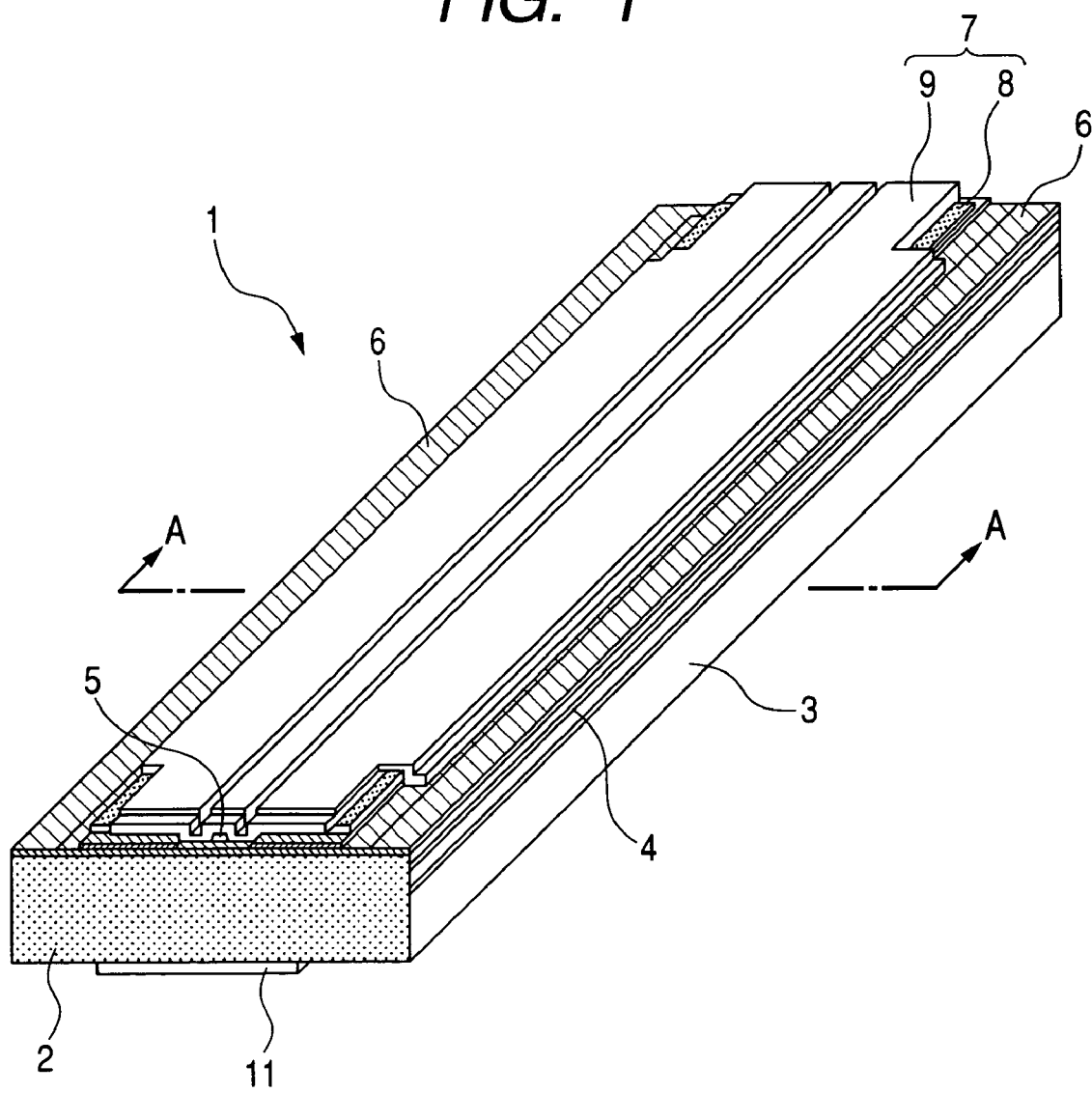
FIG. 1 is a perspective view of a semiconductor laser device manufactured by a manufacturing method of an optical semiconductor device described in the first embodiment of the present invention.

Hereinafter, the embodiments of the present invention will be described in detail referring to the drawings. In all drawings to explain the embodiments of the invention, the same code is attached to one which has the same function and the repetition of the explanation is omitted.

First Embodiment

Figure 2:
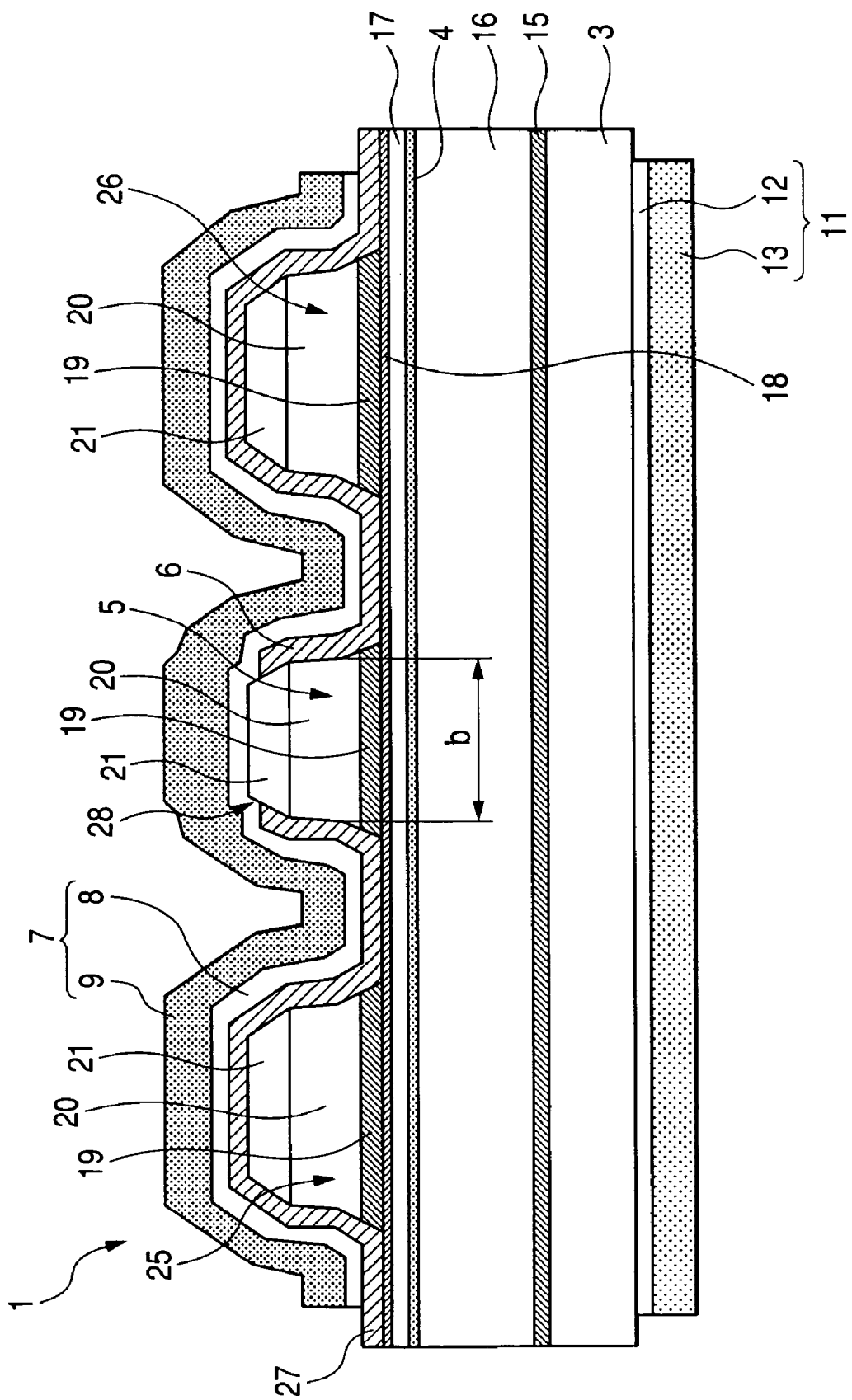
FIG. 2 is a schematic enlarged cross-sectional drawing along the line A-A in FIG. 1.

FIGS. 1 to 8 are drawings related to the first embodiment of the present invention. FIGS. 1 and 2 are drawings illustrating a structure of an optical semiconductor device manufactured by a manufacturing method of an optical semiconductor device of the first embodiment. FIG. 1 is a perspective view of an optical semiconductor laser device.

In the first embodiment, an example where the present invention is applied to the manufacture of a 0.6 μm band red semiconductor laser (semiconductor laser device) will be described.

As shown in FIG. 1, the optical semiconductor device (semiconductor laser device) 1 of the first embodiment has a slim structure. For instance, the semiconductor laser device 1 is 1540 μm long, 180 μm wide, and 100 μm high, and both end faces (output face) from which the laser beam is emitted are covered with reflection films, respectively. The forward end face shown in FIG. 1 is the former end face and the low reflection film 2 is formed thereon. The laser beam emitted through the low reflection film 2 is used for various sources of light. Moreover, although it is not shown in the figure, a high reflection film is formed on the rear end face in the back. A laser beam emitted through this high reflection film is used as a light for a monitor to detect optical intensity.

The semiconductor laser device 1 has a first conducting type (n-type) semiconductor substrate 3 and a growth of a multi-layer which includes an active layer 4 formed over the first surface (the upper surface in FIG. 1) of the semiconductor substrate 3. The semiconductor layer at the lower surface side of the active layer 4 is n-type and the semiconductor layer at the upper surface side of the active layer 4 is the second conducting type (p-type). Moreover, the stripe-shaped ridge (rib) 5 is formed by processing plural p-type semiconductor layer parts. The ridge 5 is provided in a band shape (stripe shape) along the center of the first surface side of the semiconductor laser device 1. The active layer part corresponding to this ridge 5 becomes an optical guided wave path (resonator) and laser beams are emitted from both end faces of this optical guided wave path.

Moreover, the insulating film 6 having the contact hole is formed over the upper surface of the growth of a multi-layer. Then, the anode electrode (p electrode) which is a prescribed pattern is provided over the aforementioned insulating film 6 which includes the contact hole. Although specifically not limited thereto, the anode electrode 7 consists of the electrode film 8 formed over the insulating film 6, and the Au plating film 9 formed over this electrode film 8. The electrode film 8 is provided inside of the contact hole provided in the insulating film 6 and is electrically connected to the semiconductor layer at the uppermost layer of the aforementioned growth of a multi-layer. Moreover, the cathode electrode (n electrode) 11 which becomes a prescribed pattern is formed at the second surface (the lower surface in FIG. 1) of the semiconductor substrate 3. Although specifically not limited thereto, the cathode electrode 11 consists of the electrode film formed over the second face of the semiconductor substrate 3 and the Au plating film formed overlapping this electrode film.

Next, the cross-sectional structure of the semiconductor laser device 1 will be explained with reference to FIG. 2. FIG. 2 is a schematic enlarged cross-sectional drawing along the line A-A in FIG. 1.

As shown in FIG. 2, the semiconductor laser device has growth of a multi-layer consisted of a compound semiconductor over the first surface (the upper surface in FIG. 2) of the semiconductor substrate 3. The growth of a multi-layer is composed of semiconductor layers which are laminated, in order, over the first surface of the semiconductor substrate 3. That is, over the first surface of the semiconductor substrate 3, the buffer layer 15, the first conducting type cladding layer 16, the active layer 4, the second conducting type first cladding layer 17, the etch-stop layer 18, the second conducting type second cladding layer 19, the second conducting type third cladding layer 20, and the contact layer 21 are deposited. Each semiconductor layer at the lower side of the active layer 4 are n-type including the semiconductor substrate 3, and each semiconductor layer at the upper side of the active layer 4 is p-type.

The semiconductor substrate 1 consists of an n-type GaAs substrate of a thickness of 100 μm or less. The thickness of the buffer layer 15 is composed of 0.4 μm thick GaAs layer. The first cladding layer 16 is composed of 2.5 μm thick n-type AlGaInP. The active layer 4 is about 50 nm in thickness and it has a multiple quantum well structure where, for instance, a barrier layer is composed of a 5 nm thick AlGaInP layer, a well layer is composed of a 6 nm thick GaInP layer, and three well layers are included. The second conducting type first cladding layer 17 is composed of 0.3 μm thick p-type AlGaInP. The etch-stop layer 18 is composed of a 50 nm thick p-type GaInP layer.

The second conducting type second cladding layer 19 and the second conducting type third cladding layer 20 are both composed of p-type AlGaInP layers (AlxGaInP: x=mixed crystal ratio). However, in order to improve the etching rate while wet etching, the mixed crystal ratio of Al in the second conducting type second cladding layer 19 is made to be greater than that of the second conducting type third cladding layer 20. For instance, the second conducting type third cladding layer 20 is composed of $Al_{x=0.6}GaInP$ and the second conducting type second cladding layer 20 is composed of $Al_{x=0.7}GaInP$. Therefore, when wet etching is performed on the AlGaInP by using an etchant (an etchant including HF and $H_2O$), the etching rate of the second conducting type second cladding layer 19 becomes about 150% greater compared with the second conducting type third cladding layer 20.

The second conducting type second cladding layer 19 is controlled to be from 0.2 to 0.3 μm in thickness, for instance, 0.3 μm in thickness, and the thickness of the second conducting type third cladding layer 20 becomes 1.5 μm. In the manufacture of the semiconductor laser device 1, the formation of the ridge 5 is carried out by dry etching the second conducting type third cladding layer 20 and the second conducting type second cladding layer 19 and subsequent wet etching. In dry etching, for instance, SiCl4-argon (Ar) which is a chroride system gas is used. The second wet etching is performed to determine the dimensions of the ridge width. Moreover, the tailing part is created at the base part of the ridge according to the etching performance of the dry etching. Wet etching can make this tailing part smaller. In the first embodiment, the tailing length of the tailing part can be made small, nearly zero, for instance, from 0 to 0.05 µm. Thus, in order to make the tailing part small, the tailing part which is created by dry etching has to be created in the second conducting type second cladding layer 19 which has a greater etching rate during wet etching. Then, the thickness of the second conducting type second cladding layer 19 is controlled to be 0.3 µm.

Moreover, in the first embodiment, the thickness of the second conducting type third cladding layer 20 is controlled to be from 1.4 to 1.5 µm, for instance, 1.5 µm in order to make it a semiconductor laser device 1 which has low loss by photoabsorption. That is, in a high output semiconductor laser device for a DVD, the beam aspect is made smaller by narrowing the beam flare angle in the vertical direction, and the laser beam is utilized efficiently. In a conventional semiconductor laser device, the beam flare angle in the vertical direction becomes 30 degrees or less and the beam flare angle in the horizontal direction becomes 7 degrees. In a semiconductor laser device 1 of the first embodiment, the beam flare angle in the vertical direction becomes about 17 degrees and the beam flare angle in the horizontal direction becomes about 10 degrees. When the beam flare angle in the vertical direction is made smaller like this, the permeation of light to the second conducting type third cladding layer 20 becomes greater, and the photoabsorption at the contact layer 21 increases. In order to control the increase in this photoabsorption, the second conducting type third cladding layer 20 is formed to have a thickness of 1.5 µm. The contact layer 21 is composed of about 0.4 µm thick p-type GaAs.

As shown in FIG. 2, the semiconductor laser device 1 includes one fine ridge 5 at the first surface side of the semiconductor substrate 3 and wide convex portions 25 and 26 arranged at positions which are a prescribed distance away from this ridge 5. The ridge 5 consists of the second conducting type second cladding layer 19, the second conducting type third cladding layer 20 and the contact layer 21. Moreover, the convex portions 25 and 26 also consist of the second conducting type second cladding layer 19, the second conducting type third cladding layer 20, and the contact layer 21, as well as the ridge 5. It is formed by etching the contact layer 21, the second conducting type third cladding layer 20, and the second conducting type second cladding layer 19.

The ridge 5 is provided from end to end in the vertical direction of the semiconductor laser device 1. The convex portions 25 and 26 lie along the ridge 5.

The 0.2 µm thick insulating film 6 is selectively provided at the first surface side of the semiconductor substrate 3. The insulating film 6 is a PCVD (plasma chemical vapor deposition) SiN film and it is provided on the entire area of the first surface side of the semiconductor substrate 3, and the contact hole 28 is provided to expose the upper surface of the ridge 5. As a result, the insulating film 6 becomes an insulation film for current stricture.

The 0.4 µm thick electrode film 8 is provided on the insulating film 6 to be a prescribed pattern (refer to FIG. 1) This electrode film 8 is also formed inside of the contact hole 28 and electrically connected to the contact layer 21 of the ridge 5. The electrode film 8 is a vapor deposited film where plural metals are deposited, in order. For instance, the electrode film 8 is composed of Ti—Pt—Au. Moreover, the 3.5 µm thick Au plating film 9 is provided at the upper surface of the electrode film 8 to be a prescribed pattern (refer to FIG. 1). The anode electrode (p electrode) 7 is composed of the electrode film 8 and the Au plating film 9.

Moreover, the 0.47 µm thick electrode film 12 is provided on the second surface (lower surface in FIG. 2) of the semiconductor substrate 3 to be a prescribed pattern, and the 3.5 µm thick Au plating film 13 is formed to overlap this electrode film 12. The cathode electrode (n electrode) 11 is composed of the electrode film 12 and the Au plating film 13.

Next, a manufacturing method of the semiconductor laser device 1 will be described with reference to FIGS. 3 to 7. FIGS. 3A to 3E are schematic cross-sectional drawings illustrating a part of the semiconductor substrate in each step, from the step for growth of a multi-layer to the step for ridge formation. FIG. 4 are schematic cross-sectional drawings illustrating a part of the semiconductor substrate in each step, from the step for contact hole formation to the step for dicing.

The very first step is the preparation of the semiconductor substrate 3 which is composed of a first conducting type (n-type) GaAs having the first surface and the second surface which is the opposite face of the first face. The first surface of the semiconductor substrate 3 is a crystalline plane inclined at an angle θ (for instance, θ=10 degrees) against the crystalline plane (001) of the GaAs crystal. The semiconductor substrate 3 has a thickness of several hundred µm.

Figure 3A:
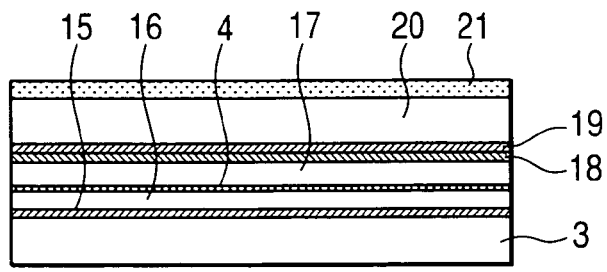
FIG. 3A is a schematic cross-sectional drawing illustrating a part of the semiconductor substrate in each step, from the step for growth of a multi-layer to the step for ridge formation, in a manufacturing method of a semiconductor laser device of the first embodiment.

Next, growth of a multi-layer is formed on the first surface of the semiconductor substrate 3 composed of n-type GaAs by using an MOCVD (organometallic vapor deposition) technique. FIG. 3A is a cross-sectional drawing illustrating a part of the semiconductor substrate 3 on which the growth of a multi-layer is formed. Moreover, this cross-section is a part where one semiconductor laser device 1 is formed. The grown multi-layer is made up of the buffer layer 15, the cladding layer 16, the active layer 4, the second conducting type first cladding layer 17, the etch-stop layer 18, the second conducting type second cladding layer 19, the second conducting type third cladding layer 20, and the second conducting type contact layer 21, each with a prescribed thickness, respectively, in one process. Since the composition and the thickness of each semiconductor layer have been already described, the explanation is omitted.

Figure 3B:
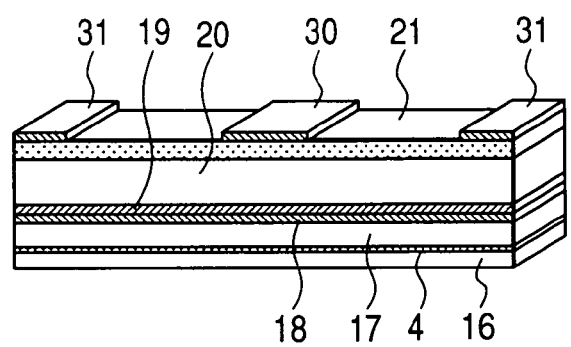
FIG. 3B is a schematic cross-sectional drawing illustrating a part of the semiconductor substrate in each step, from the step for growth of a multi-layer to the step for ridge formation, in a manufacturing method of a semiconductor laser device of the first embodiment.

Next, a SiO$_2$ film with a thickness, for instance, of 400 nm is formed over the upper surface of the contact layer 21 by using a CVD technique. Then, the SiO$_2$ film is patterned by using a common photolithography technique and an etching technique. As shown in FIG. 3B, the stripe-shaped (band-shaped) etching mask for ridge formation 30 to make the ridge 5 and the etching masks for element fixation 31 placed at positions which are a prescribed distance away from this etching mask for ridge formation 30, are formed. The width of the etching mask for ridge formation 30 is 2 µm, and the width of the etching mask for element fixation 31 is 40 µm. Moreover, the distance of the etching mask for ridge formation 30 from the etching mask for element fixation 31 is 10 µm. In figures after FIG. 3B, the semiconductor substrate 3 and the buffer layer 15 are omitted and the upper semiconductor layers from the first cladding layer 16 are shown.

Figure 3C:
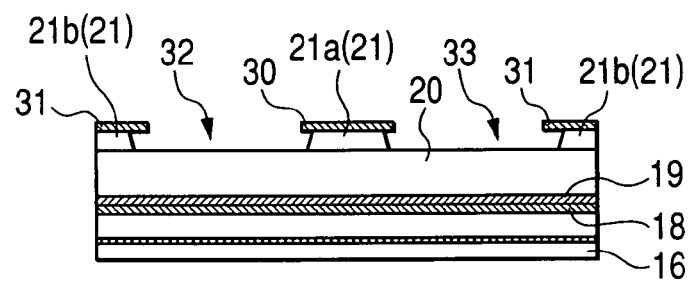
FIG. 3C is a schematic cross-sectional drawing illustrating a part of the semiconductor substrate in each step, from the step for growth of a multi-layer to the step for ridge formation, in a manufacturing method of a semiconductor laser device of the first embodiment.

Next, as shown in FIG. 3C, the anisotropic etching (wet etching) is performed on the contact layer 21 using the etching mask for ridge formation 30 and the etching mask for element fixation 31 as masks. According to these etchings, the contact layer 21 is selectively etched and the ridge part contact layer 21a is formed underneath the etching mask for the ridge formation 30, and the element fixation part contact layer 21b is formed underneath the etching mask for element fixation 31. In the state of the semiconductor laser device 1, the ridge part contact layer 21a and the element fixation part contact layer 21b are both shown as the contact layer 21.

POG (an etchant composed of phosphoric acid, hydrogen peroxide solution, and ethylene glycol) is used as an etchant, which performs anisotropic etching of the GaAs crystal. The first surface of the semiconductor substrate 3 is a crystal plane inclined at an angle θ against the crystal plane (001) of the GaAs crystal. Therefore, the contact layer 21 composed of a GaAs layer has the same crystallinity. Both sides of the ridge part contact layer 21a and the element fixation part contact layer 21b become inclined planes, respectively, by anisotropic etching. This inclined plane is the GaAs crystal plane (111). The separation grooves 32 and 33 are formed between the ridge part contact layer 21a and the element fixation part contact layer 21b.

Figure 3D:
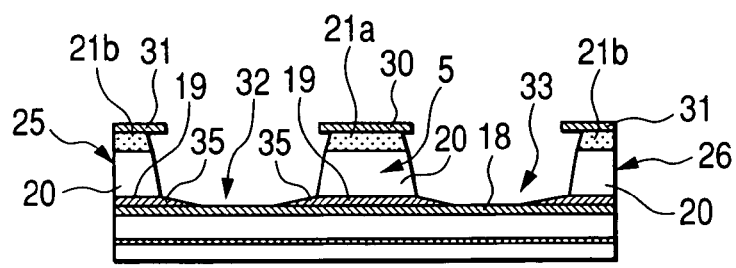
FIG. 3D is a schematic cross-sectional drawing illustrating a part of the semiconductor substrate in each step, from the step for growth of a multi-layer to the step for ridge formation, in a manufacturing method of a semiconductor laser device of the first embodiment.

Next, the second cladding layer 19 and the third cladding layer 20 are etched by using the ridge part contact layer 21a and the element fixation part contact layer 21b as masks, and the separation grooves 32 and 33 are made deeper as shown in FIG. 3D. These separation grooves 32 and 33 divide the second cladding layer 19 and the third cladding layer 20. And, the part sandwiched by these two separation grooves 32 and 33 becomes the band-shaped (stripe-shaped) ridge 5. For instance, the width of the ridge 5 is 2 μm or more. And the widths of the separation grooves 32 and 33 are 10 μm.

Figure 5A:
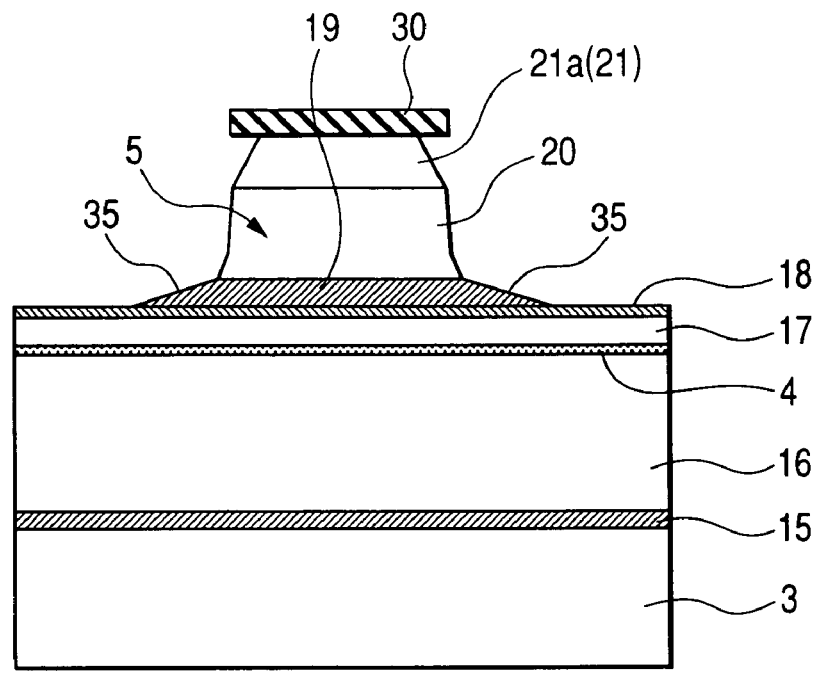
FIG. 5A is a schematic drawing illustrating a process for forming a ridge by etching two times in a manufacturing method of a semiconductor laser device of the first embodiment.

The etch-stop layer 18 appears at the bottom of the separation grooves 32 and 33. Since etching the bottom edges of the separation grooves 32 and 33 is not sufficient in the case of dry etching, the tailing parts 35 which has a long tailing length are created as shown in FIG. 3D. FIG. 5A is a schematic enlarged view illustrating the tailing parts 35 created at both sides of the ridge 5. The tailing part 35 becomes a tailing part which has a long tailing length in FIG. 5A. For instance, the tailing length becomes about 1.0 to 1.5 μm.

Figure 3E:
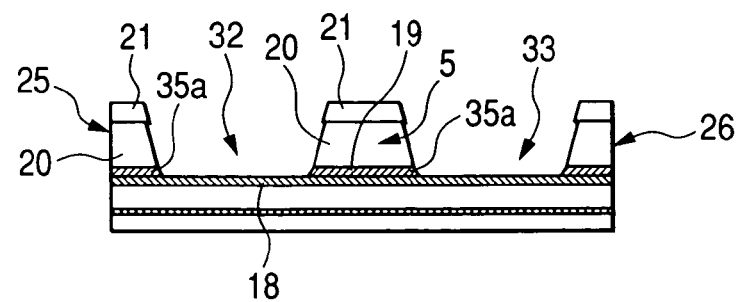
FIG. 3E is a schematic cross-sectional drawing illustrating a part of the semiconductor substrate in each step, from the step for growth of a multi-layer to the step for ridge formation, in a manufacturing method of a semiconductor laser device of the first embodiment.
Figure 5B:
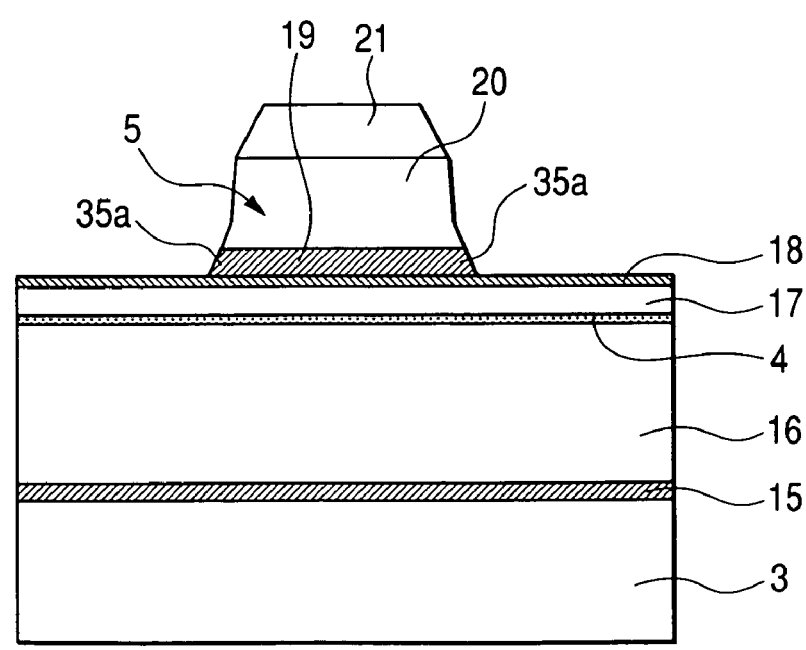
FIG. 5B is a schematic drawing illustrating a process for forming a ridge by etching two times in a manufacturing method of a semiconductor laser device of the first embodiment.

Next, wet etching is performed to determine the width dimensions of the ridge 5. In wet etching, the ridge 5 which has quadrangular cross-section is formed by wet etching using a HF system or a HCl system etchant. In this case, wet etching is performed after removing the etching mask for ridge formation 30 and the etching mask for element fixation 31. In this embodiment, wet etching is performed by using an etchant including HF and $H_2O$ as the etchant. The width of the ridge 5 is made to be 2 μm by this wet etching. Moreover, as shown in FIG. 5B and FIG. 3E, the tailing part becomes smaller and becomes the tailing part 35a which has a short tailing length due to this wet etching. The tailing part 35 shown in FIG. 5B becomes a tailing part which has a short tailing length.

Figure 10A:
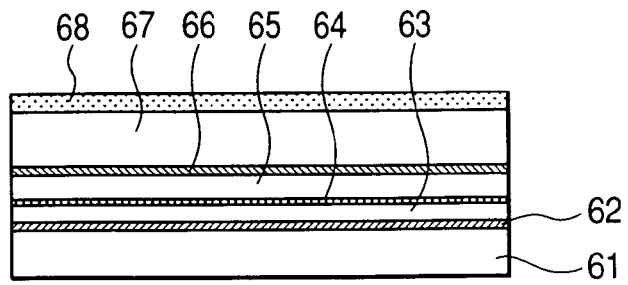
FIG. 10A is a schematic cross-sectional drawing illustrating a part of the semiconductor substrate in each step, from the step for growth of a multi-layer to the step for ridge formation, in a manufacturing method of a semiconductor laser device studied prior to this invention.
Figure 10B:
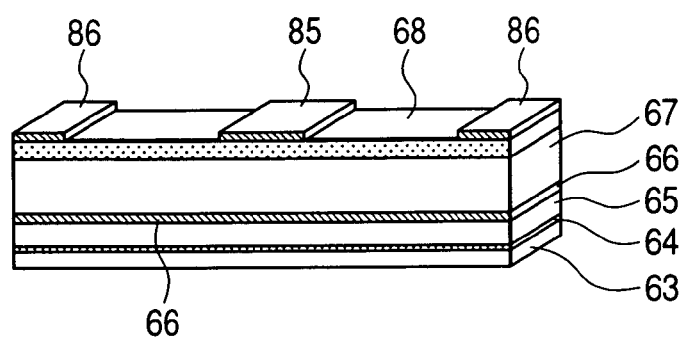
FIG. 10B is a schematic cross-sectional drawing illustrating a part of the semiconductor substrate in each step, from the step for growth of a multi-layer to the step for ridge formation, in a manufacturing method of a semiconductor laser device studied prior to this invention.
Figure 10C:
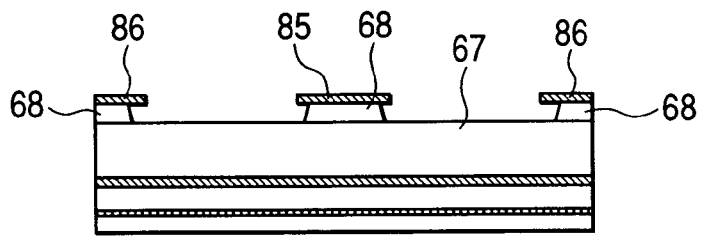
FIG. 10C is a schematic cross-sectional drawing illustrating a part of the semiconductor substrate in each step, from the step for growth of a multi-layer to the step for ridge formation, in a manufacturing method of a semiconductor laser device studied prior to this invention.
Figure 10D:
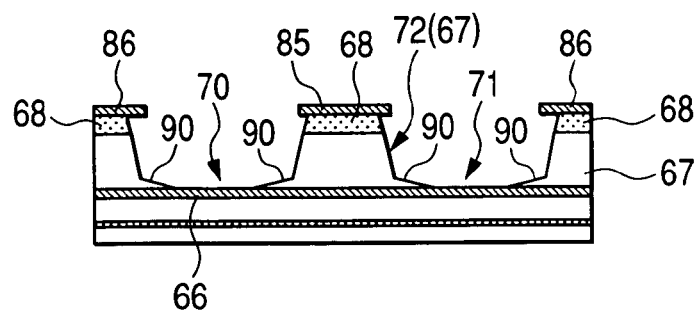
FIG. 10D is a schematic cross-sectional drawing illustrating a part of the semiconductor substrate in each step, from the step for growth of a multi-layer to the step for ridge formation, in a manufacturing method of a semiconductor laser device studied prior to this invention.
Figure 10E:
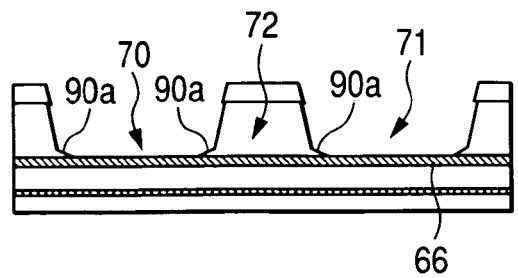
FIG. 10E is a schematic cross-sectional drawing illustrating a part of the semiconductor substrate in each step, from the step for growth of a multi-layer to the step for ridge formation, in a manufacturing method of a semiconductor laser device studied prior to this invention.
Figure 11A:
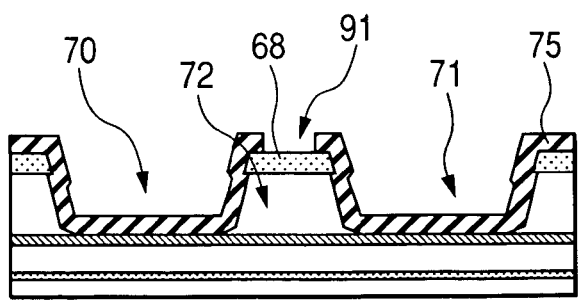
FIG. 11A is a schematic cross-sectional drawing illustrating a part of the semiconductor substrate in each step, from the step for contact hole formation to the step for dicing, in a manufacturing method of a semiconductor laser device studied prior to this invention.
Figure 11B:
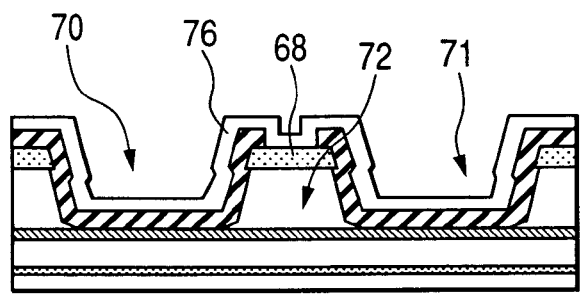
FIG. 11B is a schematic cross-sectional drawing illustrating a part of the semiconductor substrate in each step, from the step for contact hole formation to the step for dicing, in a manufacturing method of a semiconductor laser device studied prior to this invention.
Figure 11C:
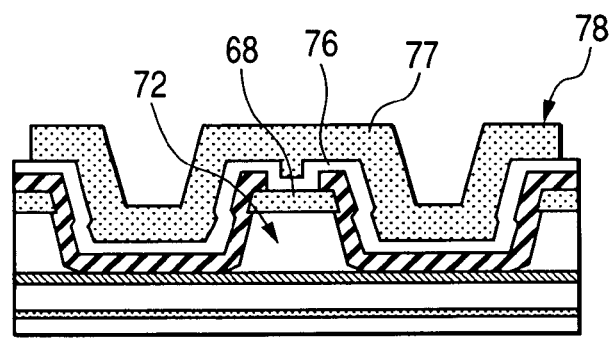
FIG. 11C is a schematic cross-sectional drawing illustrating a part of the semiconductor substrate in each step, from the step for contact hole formation to the step for dicing, in a manufacturing method of a semiconductor laser device studied prior to this invention.
Figure 11D:
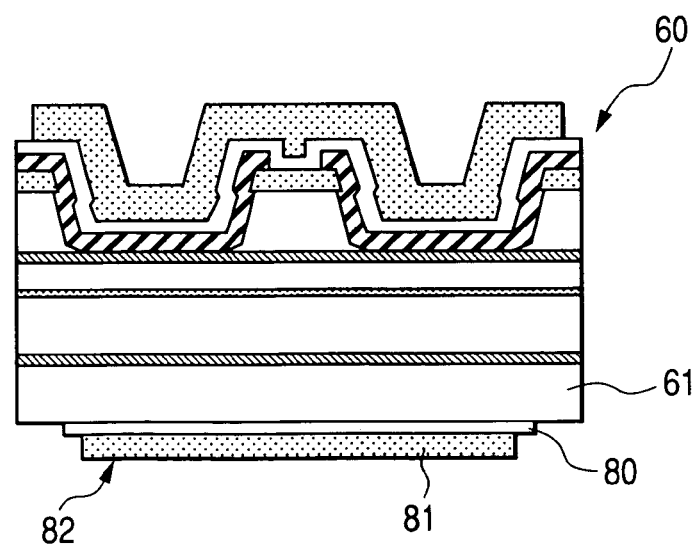
FIG. 11D is a schematic cross-sectional drawing illustrating a part of the semiconductor substrate in each step, from the step for contact hole formation to the step for dicing, in a manufacturing method of a semiconductor laser device studied in prior to this invention.

Herein, the state of the ridge 72 and the tailing part 90 formed by dry etching shown in FIG. 10D is shown in FIG. 7. FIG. 7A shows an ideal ridge 72 which has no tailing. FIG. 7B shows the ridge 72 and the tailing part 90 in the case of excessive etching during wet etching. The tailing length becomes 0.75 μm when it is long. In this case, the height (thickness) of the tailing part is about 0.06 to 0.11 μm. The right side in the figure shows the thin tailing part 35 and the left side shows the thick tailing part 35. The display mode is similar in FIGS. 7C and 7D.

Figure 7A:
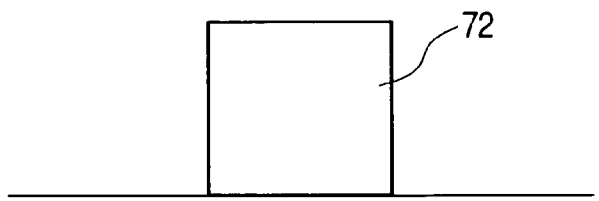
FIG. 7A is a schematic drawing illustrating an example of a tailing part created by dry etching.
Figure 7B:
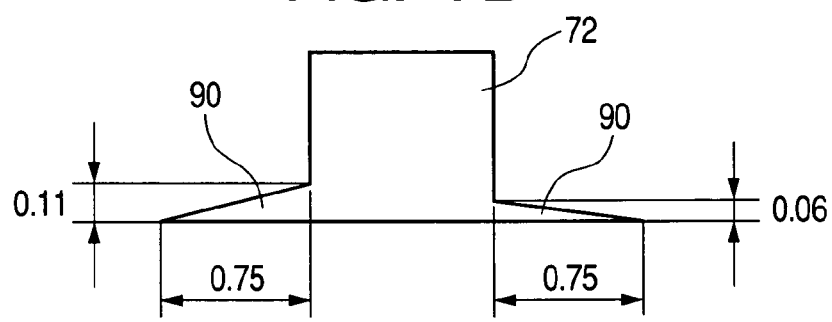
FIG. 7B is a schematic drawing illustrating an example of a tailing part created by dry etching.
Figure 7C:
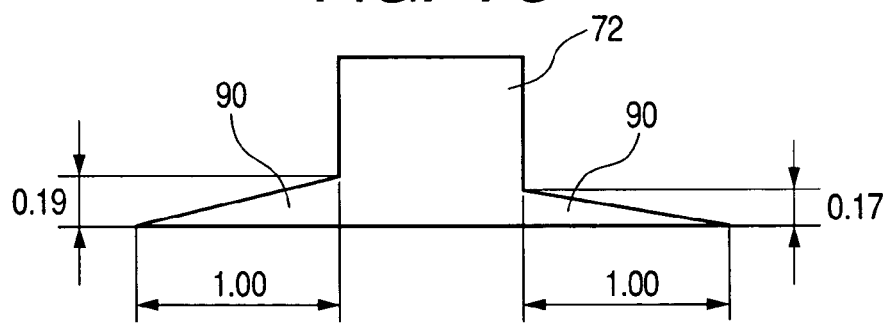
FIG. 7C is a schematic drawing illustrating an example of a tailing part created by dry etching.

FIG. 7C shows the ridge 72 and the tailing part 90 when the etching treatment is performed properly (in the case when dry etching is performed until the remaining second conducting type second cladding layer becomes 1.0 μm). The tailing length becomes about 1.00 μm when it is long. In this case, the height (thickness) of the tailing part 90 becomes about 0.17 to 0.19 μm.

Figure 7D:
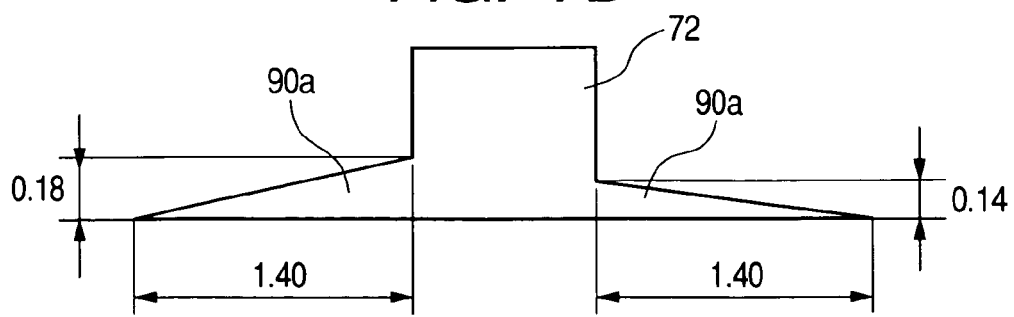
FIG. 7D is a schematic drawing illustrating an example of a tailing part created by dry etching.

FIG. 7D shows the tailing part 90a in the case when the dry etching is performed deeply to the second conducting type second clad layer until the film remaining is 0.05 μm or less in thickness and when wet etching is performed briefly for about one minute. The tailing length becomes about 1.40 μm when it is long. In this case, the height (thickness) of the tailing part 90 becomes about 0.14 to 0.18 μm. Even in this case, the thickness of the tailing part 90 after dry etching is 0.2 μm in the longest case.

As understood from FIG. 7, it may be considered that the thickness of the tailing part is a maximum of 0.2 μm. Then, in the first embodiment, a layer which has a greater etching rate than the second conducting type third cladding layer 20 by wet etching (second conducting type second cladding layer 19) is formed underneath the second conducting type third cladding layer 20, thereby, the tailing part is formed in the second conducting type second cladding layer 19. When the second conducting type third cladding layer 20 is etched to determine the width dimensions of the ridge 5, the tailing part 35 composed of the second conducting type second cladding layer 19 is etched at a greater etching rate than the second conducting type third cladding layer 20. As a result, as shown in FIG. 5B, the tailing part 35 which has a long tailing length becomes the tailing part 35a which has a short tailing length.

Figure 6:
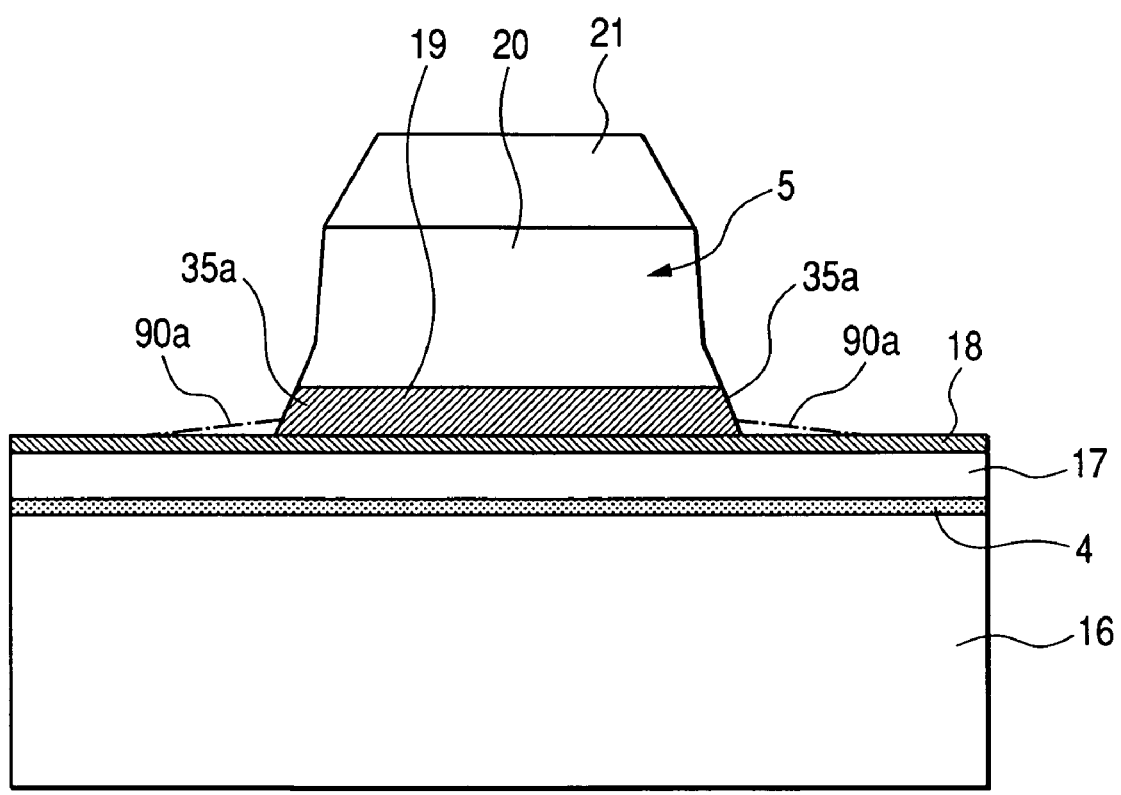
FIG. 6 is a schematic drawing which shows the tailing part in FIG. 12 overlapping the ridge formed by a manufacturing method of the optical semiconductor device of the first embodiment.
Figure 12:
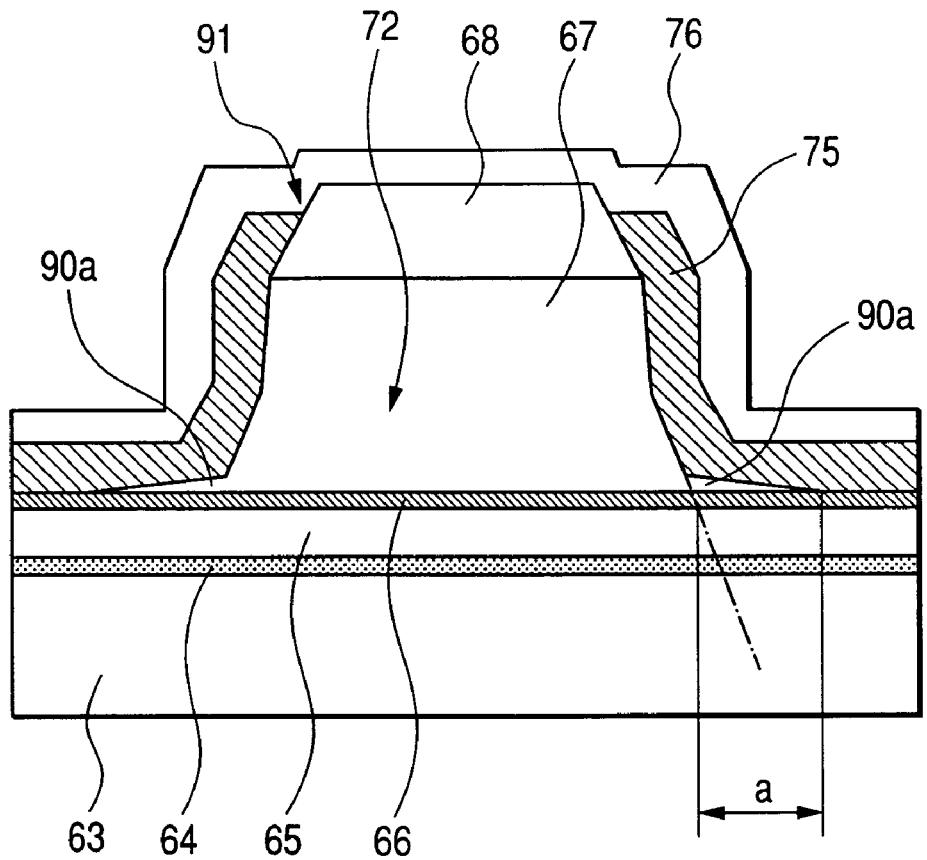
FIG. 12 is a schematic drawing illustrating the tailing condition of a ridge of a semiconductor laser device manufactured in a manufacturing method of a semiconductor laser device studied prior to this invention.
Figure 13:
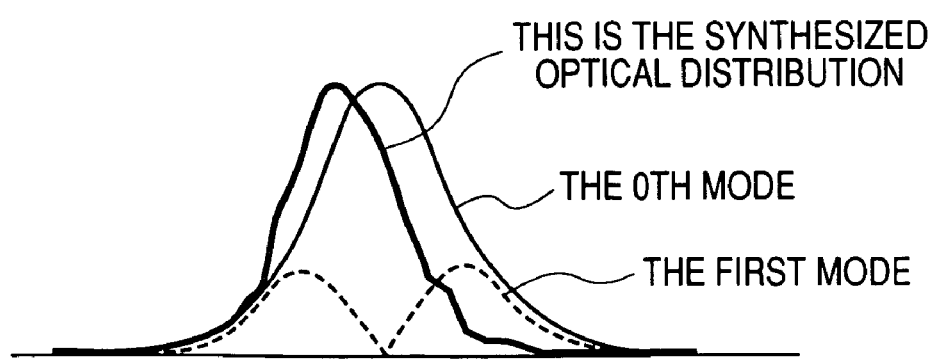
FIG. 13 is a graph illustrating an optical distribution of a far-field pattern of a laser beam.

Therefore, according to the first embodiment, the tailing part 35a can be made smaller than the one described in the manufacturing method of FIG. 10. FIG. 6 is a schematic drawing which shows the short tailing part 90a in FIG. 12 overlapping the ridge 5 and the tailing part 35a formed by a manufacturing method of the optical semiconductor device of the first embodiment. The tailing length of the tailing part 35a in the first embodiment is a maximum of 0.05 μm, and the thickness also becomes 0.05 μm or less.

Figure 4A:
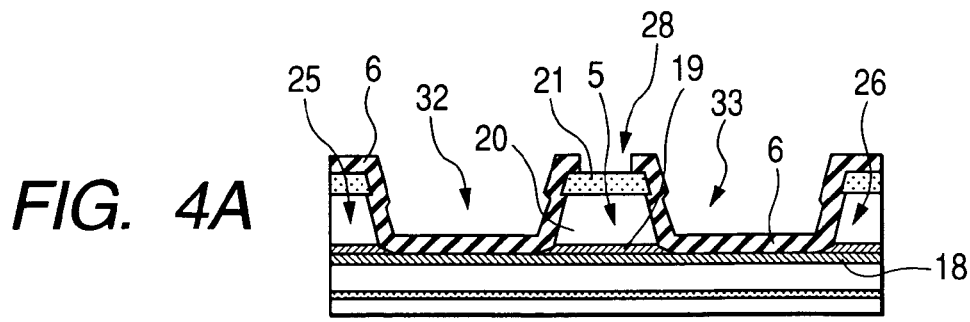
FIG. 4A is a schematic cross-sectional drawing illustrating a part of the semiconductor substrate in each step, from the step for contact hole formation to the step for dicing, in a manufacturing method of a semiconductor laser device of the first embodiment.

Next, as shown in FIG. 4A, after the insulating film 6 is formed to cover the ridge 5 and the separation grooves 32 and 33, etc. by using a PCVD technique, the contact hole 28 is formed to expose the upper surface of the ridge 5 (refer to FIG. 2). The contact hole 28 is provided along the ridge 5. The insulating layer 6 is composed of, for instance, a 200 nm thick $SiO_2$ film. The insulating cover layer composed of an $SiO_2$ film can reliably cover the structural section of both the vertical and the overhanging parts.

Figure 4B:
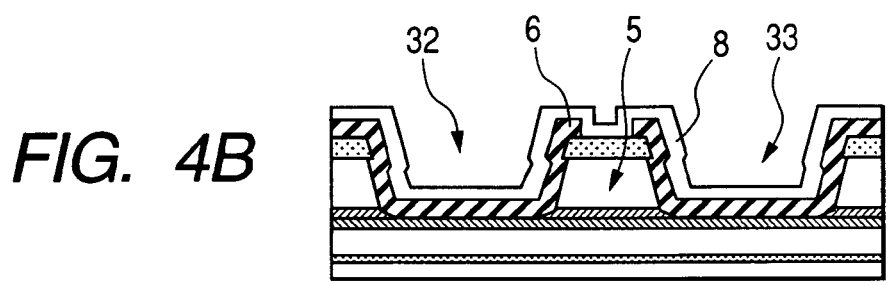
FIG. 4B is a schematic cross-sectional drawing illustrating a part of the semiconductor substrate in each step, from the step for contact hole formation to the step for dicing, in a manufacturing method of a semiconductor laser device of the first embodiment.

Next, as shown in FIG. 4B, Ti—Pt—Au is deposited over the insulating film 6, in order, to cover the ridge 5 and the separation grooves 32 and 33.

Figure 4C:
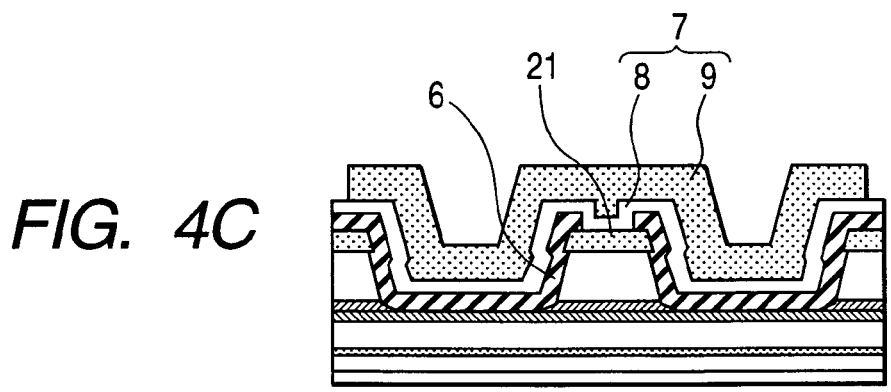
FIG. 4C is a schematic cross-sectional drawing illustrating a part of the semiconductor substrate in each step, from the step for contact hole formation to the step for dicing, in a manufacturing method of a semiconductor laser device of the first embodiment.
Figure 4D:
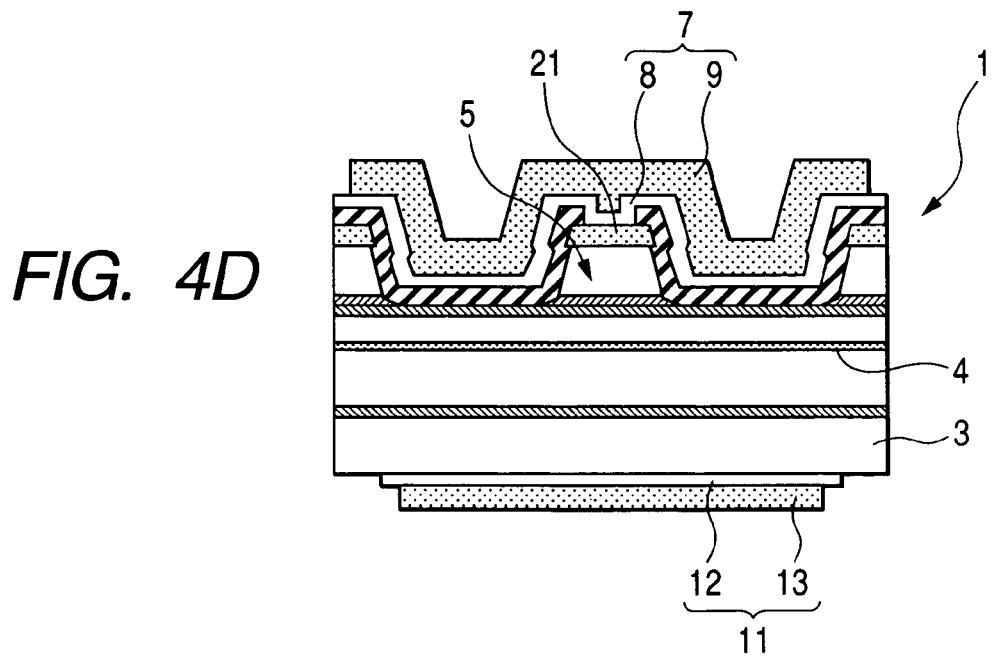
FIG. 4D is a schematic cross-sectional drawing illustrating a part of the semiconductor substrate in each step, from the step for contact hole formation to the step for dicing, in a manufacturing method of a semiconductor laser device of the first embodiment.

Next, as shown in FIG. 4C, the 3.5 μm thick Au plating film 9 is selectively formed over the upper surface of the electrode film 8. As a result, the anode electrode (p electrode) 7 is formed with electrode film 8 and Au plating film 9.

Next, although it is not shown in the figure, the second surface of the semiconductor substrate 3 is reduced to a prescribed thickness by grinding and the total thickness is controlled to be about 100 μm.

Next, the electrode film 12 is formed over the second surface of the semiconductor substrate 3 to be a prescribed pattern. The electrode film 12 is formed by depositing, for instance, a AuGaNi layer, a Cr layer, a Ni layer, and a Au layer, in order. The thickness of the electrode film 12 is 0.47 μm.

Next, a 3.5 μm thick Au plating film 13 is formed overlapping the electrode film 12. The cathode electrode (n electrode) 11 is formed with the electrode film 12 and the Au plating film 13.

Next, the semiconductor substrate 3 including the growth of a multi-layer is cut and separated throughout the length and breadth (the output face is formed by cleavage), resulting in plural semiconductor laser devices 1 being manufactured.

According to the first embodiment, the following effects can be achieved.

(1) In a manufacturing method of a semiconductor laser device 1, the second conducting type second cladding layer 19 is formed of a material which has a greater etching rate compared with the etching rate of the second conducting type third cladding layer 20 in epitaxial growth which forms the growth of a multi-layer over the first surface of the semiconductor substrate 3. That is, the second conducting type third cladding layer 20 is composed of p conducting type $Al_{x=0.6}GaInP$ and the second conducting type second cladding layer 19 is composed of 0.3 µm thick p conducting type $Al_{x=0.7}GaInP$. Moreover, when the ridge 5 is formed by dry etching, the tailing parts 35 which have a long etching length are created at the base part of the ridge according to the etching performance of the dry etching. Since the second conducting type second cladding layer 19 is controlled to be 0.3 µm in thickness, the tailing parts 35 are formed of the second conducting type second cladding layer 19. Therefore, when wet etching is preformed to determine the width dimensions of the ridge 5, the tailing part 35 composed of the second conducting type second cladding layer 19 is etched at a greater etching rate than the second conducting type third cladding layer 20, resulting in the tailing part 35 becoming smaller. That is, the tailing length of the tailing part 35 becomes shorter, for instance, from about 0 to 0.05 µm. As a result, a high-order mode such as the 1st mode, etc. does not occur in the far-field pattern (FFP) of the manufactured semiconductor laser device 1 and the far-field pattern becomes 0th mode having a symmetric single peak distribution. A semiconductor laser device 1 where the optical distribution of the far-field pattern is not disordered is preferable for a light source of a DVD, etc. where light is introduced by using a lens system.

(2) The semiconductor laser device 1 becomes a semiconductor laser device which has low loss by photoabsorption. In the high output semiconductor laser element for a DVD, the beam aspect is made smaller by narrowing the beam flare angle in the vertical direction and the laser beam is utilized efficiently. In a conventional semiconductor laser device, the beam flare angle in the vertical direction becomes 30 degrees and the beam flare angle in the horizontal direction becomes 7 degrees. In a semiconductor laser device 1 of the first embodiment, the beam flare angle in the vertical direction becomes 17 degrees and the beam flare angle in the horizontal direction becomes 10 degrees. When the beam flare angle in the vertical direction is made smaller like this, the permeation of light into the second conducting type second and third cladding layers becomes greater and the photoabsorption at the GaAs contact layer 21 increases. In order to control the increase in this photoabsorption, the second conducting type third cladding layer 20 is formed to have a thickness of 1.5 µm in the embodiment.

(3) Since the contact layer 21 is etched by using an anisotropic wet etching technique, the edges of the ridge part contact layer 21a and the element fixation part contact layer 21b are formed at an incline. By forming them at an incline, the step coverage property (step coating property) by the insulating film 6 becomes excellent when the insulating film 6 is formed afterward to cover the surface of the ridge, resulting in the reliability of the semiconductor laser device 1 being improved.

Figure 8A:
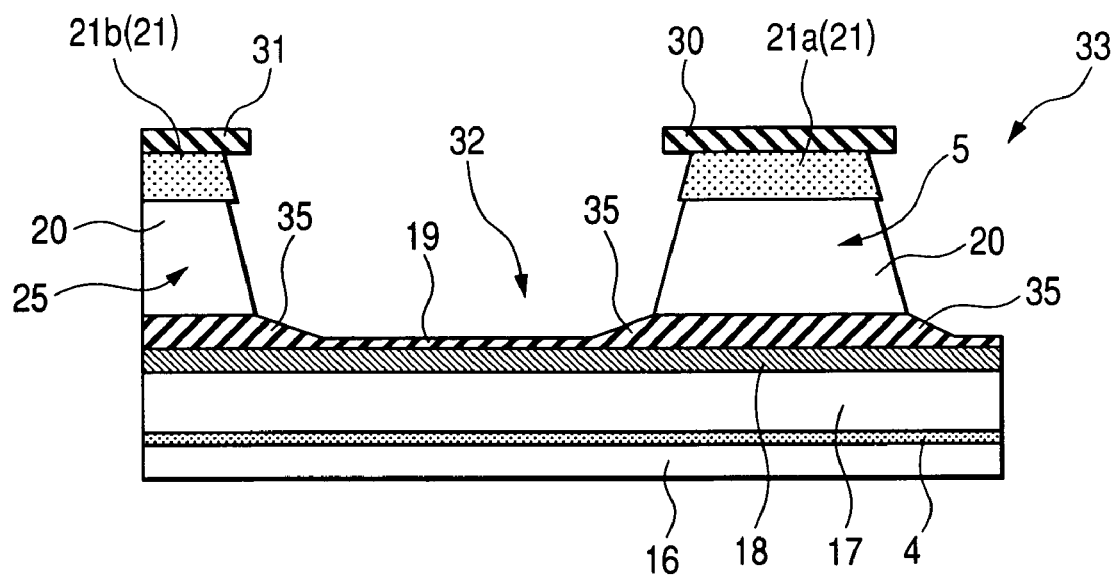
FIG. 8A is a schematic drawing illustrating another method for forming a ridge.
Figure 8B:
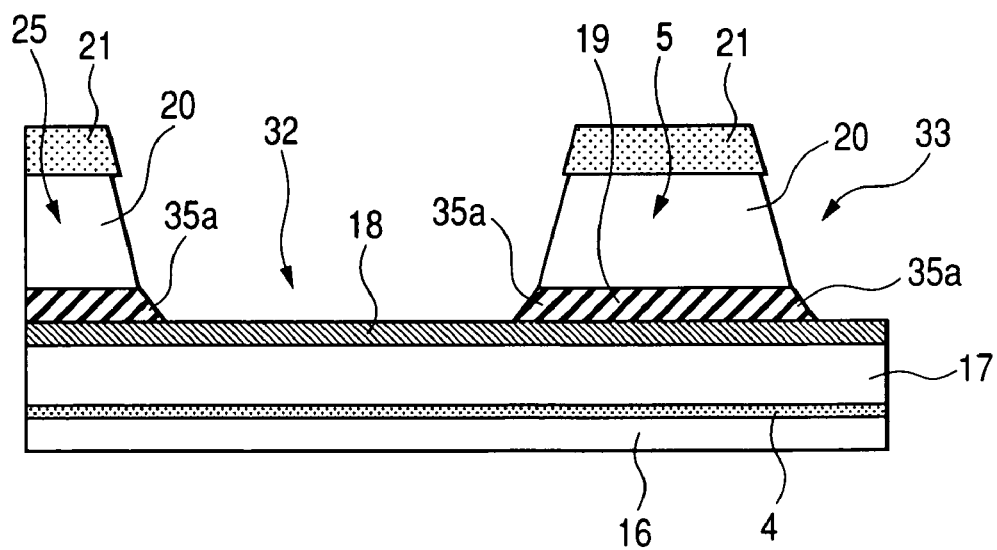
FIG. 8B is a schematic drawing illustrating another method for forming a ridge.

Up to this point the invention which was developed by the inventors has been concretely described using the embodiment. However, the present invention is not intended to be limited by the aforementioned embodiment and various modifications may be made by one skilled in the art without departing from the spirit of the invention. When dry etching is performed to form the ridge 5 in the embodiment, etching is carried out to expose the etch-stop layer 18 at the bottom of the separation grooves 32 and 33 by dry etching. However, as shown in FIG. 8A, the second conducting type second cladding layer 19 may be etched to leave a thickness of 0.08 to 0.1 µm in the dry etching and the second conducting type second cladding layer 19 which remains may be etched in the wet etching. In this case, since the thickness of the second conducting type second cladding layer 19 is 0.3 µm, the tailing part 35 created by dry etching is formed of the second conducting type second cladding layer 19 even if dry etching is performed so as to leave the second conducting second cladding layer 19 with a thickness from 0.08 to 0.1 µm. Therefore, when the width dimension of the ridge 5 are determined by etching the second conducting type third cladding layer 20 [it1]using a wet etching technique, the tailing part 35 composed of the second conducting type second cladding layer 19 which has a greater etching rate than the second conducting type third cladding layer 20 is more heavily etched, thereby, the tailing part 35 becomes the tailing part 35a which has a short tailing length.

As a result, a high-order mode such as the 1st mode, etc. does not occur in the far-field pattern (FFP) of the manufactured semiconductor laser device and the far-field pattern becomes 0th mode having a symmetric single peak distribution.

Moreover, in the embodiment, an example where the present invention is applied to a 0.6 µm band semiconductor laser device is described. However, it can be similarly applied to a manufacturing method of other semiconductor laser devices, for instance, a semiconductor laser device having an emission wavelength of 0.78 µm.

What is claimed is:

1. A manufacturing method of an optical semiconductor device comprising;
   (a) a step for preparing a semiconductor substrate which is a first conducting substrate having a first surface and a second surface which becomes an opposite surface of the first surface,
   (b) a step for performing continuous epitaxial growth so as to deposit a first conducting cladding layer, an active layer, a second conducting first cladding layer, a second conducting etch-stop layer, a second conducting second cladding layer, a second conducting third cladding layer, and a second conducting contact layer, in order, over said first surface of said semiconductor substrate,
   (c) a step for forming a stripe-shaped etching mask for ridge formation over said contact layer and an etching mask for element fixation which is situated separated by a prescribed distance at the both sides of said etching mask for ridge formation, by a coating film formation and selective etching of said coating film,
   (d) a step for etching said contact layer from the top face to the bottom surface using both said etching masks as a mask and forming a ridge part contact layer and an element fixation part contact layer below said etching mask for ridge formation and said etching mask for element fixation,
   (e) a step for dry-etching a second conducting second cladding layer and a second conducting third cladding layer using both said etching masks as a mask to reach said etch-stop layer and forming a ridge,
   (f) a step for making the width of said ridge a prescribed dimension by wet-etching after removing both said masks,
   (g) a step for forming an insulating film over the upper surface of said ridge and forming a contact hole at said first surface side of said semiconductor substrate, (h) a step for forming a first electrode contacting said ridge part contact layer through said contact hole over said insulating film, (i) a step for forming a second electrode at said second face side of said semiconductor substrate, wherein, in the epitaxial growth of said step (b), said second conducting second cladding layer is composed of a material which has a greater etching rate compared with the etching rate of said second conducting third cladding layer while wet etching in said step (f).

2. A manufacturing method of an optical semiconductor device according to claim 1, wherein said second conducting second cladding layer is formed to be from 0.2 to 0.3 µm in thickness in the epitaxial growth of said step (b).

3. A manufacturing method of an optical semiconductor device according to claim 1, wherein said second conducting third cladding layer is formed to be from 1.4 to 1.5 µm in thickness in the epitaxial growth of said step (b).

4. A manufacturing method of an optical semiconductor device according to claim 1, wherein the width of said ridge is formed to be from 1 to 2 µm in the wet etching of said step (f).

5. A manufacturing method of an optical semiconductor device according to claim 1, wherein the edges of said ridge part contact layer and said element fixation part contact layer are formed at an incline by wet etching using an anisotropic etching technique in said step (d).

6. A manufacturing method of an optical semiconductor device according to claim 1, wherein, in the epitaxial growth of said step (b), over the first surface of the GaAs substrate said first cladding layer is formed of an AlGaInP layer; said active layer is formed as a multiple quantum well structure consisting of an AlGaInP layer barrier layer and a GaInP layer well layer; said second conducting first, second, and third cladding layers are each formed of AlGaInP layers, respectively; said etch-stop layer is formed of a layer including at least one layer or more of GaInP layer; and said contact layer is formed of a GaAs layer.

7. A manufacturing method of an optical semiconductor device according to claim 1, wherein said second cladding layer and said second conducting second and third cladding layers are both composed of p-conducting $Al_xGaInP$ and the mixed crystal ratio x of Al in the second conducting second cladding layer is greater than that in said second conductive third cladding layer.

8. A manufacturing method of an optical semiconductor device according to claim 1, wherein said second conducting third cladding layer is composed of p-conducting $Al_{x=0.6}GaInP$ and said second conducting second cladding layer is composed of p-conducting $Al_{x=0.7}GaInP$.

9. A manufacturing method of an optical semiconductor device according to claim 1, wherein a buffer layer composed of a first conducting semiconductor is formed between said semiconductor substrate and said first conducting cladding layer in said step (b).

10. A manufacturing method of an optical semiconductor device according to claim 1, wherein said second conducting second and third cladding layers are etched to remain from 0.08 to 0.1 µm in thickness in the dry etching of said step (e), and said second conducting second cladding layer which remains is etched in the wet etching of said step (f).

11. A manufacturing method of an optical semiconductor device comprising;

(a) a step for preparing a semiconductor substrate which is a first conducting substrate having a first surface and a second surface which becomes an opposite surface of the first surface, (b) a step for performing continuous epitaxial growth so as to deposit a first conducting cladding layer, an active layer, a second conducting first cladding layer, a second conducting etch-stop layer, a second conducting second cladding layer, a second conducting third cladding layer, and a second conducting contact layer, in order, over said first surface of said semiconductor substrate, (c) a step for forming a stripe-shaped etching mask for ridge formation over said contact layer and an etching mask for element fixation which is situated separated by a prescribed distance at the both sides of said etching mask for ridge formation, by a coating film formation and selective etching of said coating film, (d) a step for etching said contact layer from the top face to the bottom surface using both said etching masks as a mask and forming a ridge part contact layer and an element fixation part contact layer below said etching mask for ridge formation and said etching mask for element fixation, (e) a step for dry-etching a second conducting second cladding layer and a second conducting third cladding layer using both said etching masks as a mask to reach said etch-stop layer and forming a ridge, (f) a step for making the width of said ridge a prescribed dimension by wet-etching after removing both said masks, (g) a step for forming an insulating film over the upper surface of said ridge and forming a contact hole at said first surface side of said semiconductor substrate, (h) a step for forming a first electrode contacting said ridge part contact layer through said contact hole over said insulating film, (i) a step for forming a second electrode at said second face side of said semiconductor substrate, wherein, in the epitaxial growth of said step (b), said second conducting second cladding layer is composed of a material which has a greater etching rate compared with the etching rate of said second conducting third cladding layer while wet etching in said step (f), and wherein said second cladding layer and said second conducting second and third cladding layers are both composed of p-conducting $Al_xGaInP$ and the mixed crystal ratio x of Al in the second conducting second cladding layer is greater than that in said second conductive third cladding layer.

12. A manufacturing method of an optical semiconductor device comprising;

(a) a step for preparing a semiconductor substrate which is a first conducting substrate having a first surface and a second surface which becomes an opposite surface of the first surface, (b) a step for performing continuous epitaxial growth so as to deposit a first conducting cladding layer, an active layer, a second conducting first cladding layer, a second conducting etch-stop layer, a second conducting second cladding layer, a second conducting third cladding layer, and a second conducting contact layer, in order, over said first surface of said semiconductor substrate, (c) a step for forming a stripe-shaped etching mask for ridge formation over said contact layer and an etching mask for element fixation which is situated separated by a prescribed distance at the both sides of said etching mask for ridge formation, by a coating film formation and selective etching of said coating film, (d) a step for etching said contact layer from the top face to the bottom surface using both said etching masks as a mask and forming a ridge part contact layer and an element fixation part contact layer below said etching mask for ridge formation and said etching mask for element fixation, (e) a step for dry-etching a second conducting second cladding layer and a second conducting third cladding layer using both said etching masks as a mask to reach said etch-stop layer and forming a ridge, (f) a step for making the width of said ridge a prescribed dimension by wet-etching after removing both said masks, (g) a step for forming an insulating film over the upper surface of said ridge and forming a contact hole at said first surface side of said semiconductor substrate, (h) a step for forming a first electrode contacting said ridge part contact layer through said contact hole over said insulating film, (i) a step for forming a second electrode at said second face side of said semiconductor substrate, wherein, in the epitaxial growth of said step (b), said second conducting second cladding layer is composed of a material which has a greater etching rate compared with the etching rate of said second conducting third cladding layer while wet etching in said step (f), and wherein said second conducting third cladding layer is composed of p-conducting $Al_{x=0.6}GaInP$ and said second conducting second cladding layer is composed of p-conducting $Al_{x=0.7}GaInP$.

* * * * *